United States Patent [19]

Hashimoto

[11] Patent Number: 5,214,306
[45] Date of Patent: May 25, 1993

[54] LIGHT EMITTING DIODE
[75] Inventor: Masayasu Hashimoto, Tottori, Japan
[73] Assignees: Sanyo Electric Co., Ltd., Osaka; Tottori Sanyo Electric Co., Ltd., Tottori, both of Japan
[21] Appl. No.: 824,803
[22] Filed: Jan. 22, 1992
[30] Foreign Application Priority Data Jan. 29, 1991 [JP] Japan .................................. 3-9333

[51] Int. Cl.$^5$ ............................................ H01L 33/00
[52] U.S. Cl. ................................. 257/632; 257/100; 257/79
[58] Field of Search ......................... 357/17, 30, 52; 257/632, 100, 79

[56] References Cited

U.S. PATENT DOCUMENTS

| | | | |
|---|---|---|---|
| 4,095,011 | 6/1978 | Hawrylo et al. | 428/469 |
| 4,197,141 | 4/1980 | Bozler et al. | 136/89 |
| 4,354,198 | 10/1982 | Hodgson et al. | 357/16 |
| 4,656,638 | 4/1987 | Tihanyi et al. | 372/49 |
| 4,723,253 | 2/1988 | Hayakaya et al. | 357/50 |
| 4,751,201 | 6/1988 | Nottenburg et al. | 437/255 |
| 4,801,993 | 1/1989 | Ankri et al. | 357/40 |

Primary Examiner—Andrew J. James
Assistant Examiner—Stephen D. Meier
Attorney, Agent, or Firm—Darby & Darby

[57] ABSTRACT

A light emitting diode composed of a compound semiconductor containing aluminum having a GaAlAs layer and the like and having a structure which is superior in humidity resistance and has a long life. For example, in a double hetero light emitting diode constructed by comprising a p-GaAlAs layer, an n-GaAlAs layer, and an active layer interposed between both the GaAlAs layers, an oxide layer containing the oxide of gallium is provided inside of the surface excluding a portion where an electrode is provided of its semiconductor device, so that the surface of the device is stabilized. On the other hand, in the structure of a light emitting diode in which stepped portions are provided in the peripheral part of its semiconductor device, an oxide layer is provided inside of the surface of the device and inside of the peripheral part, and an insulating layer is formed on the oxide layer on the surface of the device.

20 Claims, 3 Drawing Sheets

LIGHT EMITTING DIODE

BACKGROUND OF THE INVENTION

1. Field of the Invention

The present invention relates generally to a light emitting diode composed of a compound semiconductor containing aluminum, and more particularly, to a light emitting diode having a structure which is superior in humidity resistance and has a long life.

2. Description of the Prior Art

In a light emitting diode composed of a compound semiconductor containing aluminum having a gallium aluminum arsenic (GaAlAs) layer and the like, an insulating layer (coating film) composed of silicon nitride has been conventionally formed on the surface of its device so as to increase humidity resistance and improve light extraction efficiency, as disclosed in, for example, Japanese Patent Laid-Open Gazette No. 226181/1989. Such a structure is formed as the measures of the problem peculiar to a compound semiconductor containing aluminum that the oxide or the hydroxide of aluminum is liable to be mainly formed on the upper surface of the device, thereby to form a light absorbing layer as well as to degrade the device and decrease the luminance under humidity conditions, so that the life of the device is significantly reduced.

In such a structure, however, the above described insulating layer does not sufficiently adhere to the upper surface of the above described device or is damaged due to, for example, heat treatment for ohmic contact of electrodes and the impact in the subsequent process of assembling a lamp and the like. Consequently, such circumstances have often occur that the above described oxide or hydroxide of aluminum is expanded, irrespective of the presence of the insulating layer, on the surface of the device centered around a portion where the insulating layer does not sufficiently adhere or is damaged, so that the life of the device is reduced.

Particularly in a structure in which stepped portions are formed in the peripheral part of the above described device by mesa etching, such a phenomenon is, in many cases, centered around edge parts of the stepped portions.

SUMMARY OF THE INVENTION

A primary object of the present invention is to provide a new light emitting diode composed of a compound semiconductor containing aluminum in which the above described problems are solved.

Another object of the present invention is to provide a light emitting diode composed of a compound semiconductor containing aluminum which is superior in humidity resistance and has a long life by comprising an oxide layer containing the oxide of gallium inside of the upper surface of its semiconductor device.

The present invention provides a light emitting diode composed of a compound semiconductor containing aluminum which is constructed, in the structure of no treating mesa etching type semiconductor device having no stepped portions in its peripheral part, by having a thermal oxide layer containing the oxide of gallium provided inside of at least the upper surface excluding a portion where an electrode is provided of the semiconductor device.

Furthermore, the present invention provides a light emitting diode composed of a compound semiconductor containing aluminum which is constructed, in the structure of a treating mesa etching type semiconductor device having stepped portions in its peripheral part, by having a thermal oxide layer containing the oxide of gallium provided inside of at least the upper surface excluding a portion where an electrode is provided of the semiconductor device as well as laminating an insulating layer on the oxide layer on the upper surface of the above described device.

The foregoing and other objects, features, aspects and advantages of the present invention will become more apparent from the following detailed description of the present invention.

DETAILED DESCRIPTION OF THE PREFERRED EMBODIMENT

First Embodiment

Figure 1:
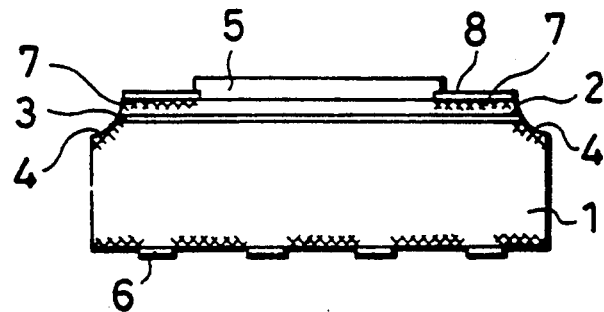
FIG. 1 is a schematic diagram showing a cross-sectional structure of a light emitting diode according to a first embodiment of the present invention.

A light emitting diode shown in FIG. 1 is a double hetero gallium aluminum arsenic (GaAlAs) light emitting diode in which the effect of the present invention is most largely recognized.

The light emitting diode comprises, for example, a p-GaAlAs layer 1 serving as a first GaAlAs layer, an n-GaAlAs layer 2 serving as a second GaAlAs layer, and a p-GaAlAs active layer 3 interposed between both the GaAlAs layers 1 and 2. The light emitting diode further comprises stepped portions 4 provided in the peripheral part of its semiconductor device, as well as an n electrode 5 and a p electrode 6 provided on the upper surface and lower surface of the semiconductor device.

An oxide layer 7 containing the oxide of gallium is, provided centered around the exposed parts of the upper surface of the above described device and the above described stepped portions 4. In addition, the oxide layer 7 is provided on the lower surface of the device. However, even if it is not provided on the lower surface of the device, the effect as described later is obtained. An insulating layer (coating film) 8 composed of silicon nitride of the like is formed on the oxide layer 7 on the upper surface of the device. It is preferable that the insulating layer 8 is also provided in the stepped portions 4. However, even if it is not provided in the stepped portions 4, the effect as described later is obtained. Accordingly, when the workability in a case where the insulating layer 8 is provided is considered, the insulating layer 8 need not be necessarily provided.

Such a light emitting diode is constructed in, for example, the following manner.

Figure 2A:
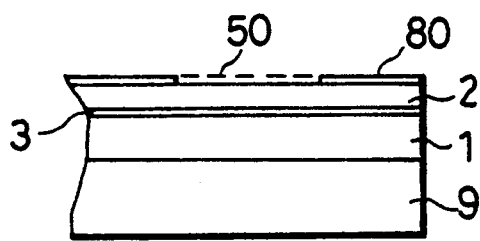
FIGS. 2A to 2D are diagrams for explaining the manufacturing processes of the light emitting diode shown in FIG. 1.

First, a p-GaAlAs layer 1, a p-GaAlAs active layer 3, and an n-GaAlAs layer 2 are sequentially formed on a GaAs substrate 9 by epitaxial growth, an insulating layer 80 composed of silicon nitride or the like is formed on the upper surface thereof, as shown in FIG. 2A and then, a part of the insulating layer 80 which corresponds to a portion 50 where an electrode is to be provided is removed.

It is preferable for the reasons as described later that a thermal oxide layer (a layer equivalent to the oxide layer 7) has been formed on the upper surface of the above described n-GaAlAs layer 2 by previously subjecting the above described substrate to heat treatment at temperatures of 455° to 480° C. before the insulating layer 80 is formed.

A part of the above described insulating layer 80 which corresponds to the above described portion 50 where an electrode is to be provided is removed by, for example, $CF_x$ dry etching. At this time, even if the above described thermal oxide layer has been formed on the upper surface part of the n-GaAlAs layer 2, this thermal oxide layer is removed by the described above dry etching, not to interfere with ohmic contact of electrodes.

Figure 2C:
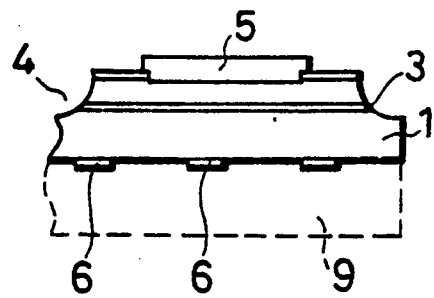
Figure 2B:
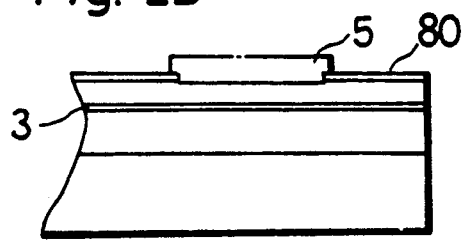

An n electrode 5 is formed on the n-GaAlAs layer 2, as shown in FIG. 2B.

Thereafter, the above described p-GaAs substrate 9 is removed as required, so that a p electrode 6 is formed on the lower surface of the above described p-GaAlAs layer 1 which is exposed by this removal (see FIG. 2C). When the p-GaAs substrate 9 is not removed, the p electrode 6 is formed on the lower surface of the p-GaAs substrate 9 (which is not shown).

The shapes, the numbers, and the arrangements of both the above described electrodes 5 and 6 are respectively determined in consideration of the current distribution, the direction of light extraction and the like, as the conventional example.

Figure 2D:
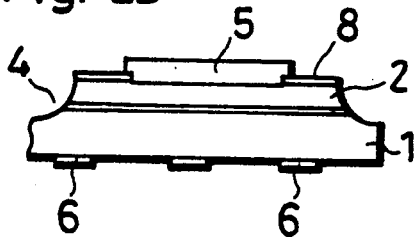

Thereafter, mesa etching is made from the upper surface of the above described n-GaAlAs layer 2 to conform to the size of the device, so that recess portions corresponding to the above described stepped portions 4 are formed (see FIG. 2D). Subsequently, an oxide layer 7 is formed on the exposed upper surface parts of the stepped portions 4 by annealing treatment also serving as ohmic contact of the electrodes, resulting in device isolation. In addition, the oxide layer 7 is also formed on the exposed part of the lower surface of the device.

The above described annealing treatment must be carried out to a sufficient degree to form the oxide layer 7, for example, at temperatures of 455° to 490° C. for 5 to 30 minutes. It is not preferable that the heating temperature at this time is excessively increased because the above described electrodes are adversely affected.

In such an oxide layer 7, gallium and aluminum are oxidized at a rate of approximately 100 per cent, and arsenic is also oxidized at a high rate, for example, on the upper surface part of the above described device. In such oxide 7, for example, for gallium and aluminum are oxidized at almost 100% oxidation rate in an upper surface of the above-mentioned device, and arsenic is also oxidized at a high oxidation rate. An oxidation rate of gallium means a numeric value obtained by dividing the number of molecules of gallium oxide by the sum of the number of molecules of gallium and the number of molecules of the gallium oxide, and then multiplying a quotient by 100. An oxidation rate of aluminum means a numeric value obtained by dividing the number of molecules of aluminum oxide by the sum of the number of molecules of aluminum and the number of molecules of the aluminum oxide, and then multiplying the quotient by 100. An oxidation rate of arsenic means a numeric value obtained by dividing the number of molecules of arsenic oxide by the sum of the number of molecules of arsenic and the number of molecules of the arsenic oxide, and then multiplying a quotient by 100. In this specification, an average oxidation rate means an arithmetic average value of rates of oxidation of the gallium, aluminum and arsenic respectively.

In respect of this point, even when the device is left in a natural state, oxidation is carried out on the surface part of the device. In this case, however, aluminum is oxidized at a rate of 10 per cent and gallium is slightly oxidized, while arsenic is hardly oxidized. Moreover, such natural oxidation is carried out only in the outermost surface part of the device. The oxidation of aluminum is only recognized in an area where the surface part of the device is removed by 0.001 to 0.009 μm. On the other hand, in the present invention, the oxidation rate of arsenic is only lowered, while the oxidation rates of aluminum and gallium are hardly lowered even in the above described area.

Consequently, in the present invention, the oxide layer 7 containing the oxide of gallium is obtained. The oxide layer 7 can be easily confirmed if it is analyzed, for example, in the usual analysis of elements after previously cutting the upper surface of the device by sputtering.

The average oxidation rate within a depth of 0.01 μm from the upper surface of the above described device in the present invention is approximately 50 to 95% and more preferably, 80 to 95%. The average oxidation rate under the same condition in a case where the effect cannot be confirmed is not more than 40%.

Although it becomes clear that the humidity resistance of the above described light emitting diode is improved and the degradation of the semiconductor device is reduced by the formation of such an oxide film 7, the reason for this is not clearly known at the present time. However, excessive arsenic in the outermost surface part of the device is scattered by the above described heat treatment, and the dispersion of arsenic inside of the device is restrained by the above described oxide of gallium. In addition, the movement and the deposition of aluminum are restrained due to the physical surface coating of the oxide of gallium and the stabilization of a pair of aluminum arsenide caused by the formation of the oxide of gallium. Consequently, it is presumed that the promotion of the oxidation of aluminum is restrained.

Therefore, it is preferable that the thermal oxide layer is provided even in the early stage of the above described fabrication. The reason for this is that the surface of the device which is brought into contact with the insulating coating film is stabilized by the oxide layer containing the oxide of gallium, so that it can be expected that the cause of the degradation during the fabrication is removed.

Second Embodiment

Figure 3:
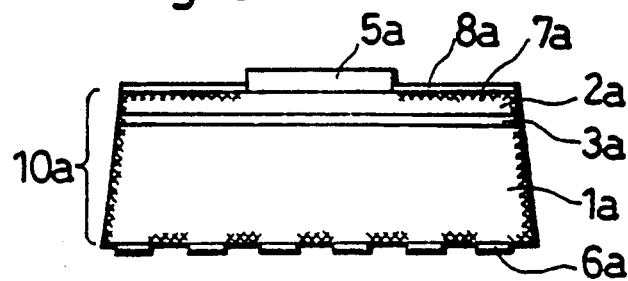
FIG. 3 is a schematic diagram showing a cross-sectional structure of a light emitting diode according to a second embodiment of the present invention.

FIG. 3 shows a double hetero junction and no treating mesa etching type light emitting diode.

The light emitting diode comprises, for example, a p-GaAlAs layer 1a, an n-GaAlAs layer 2a, and a p-GaAlAs active layer 3a interposed between both the GaAlAs layers 1a and 2a. In addition, the light emitting diode comprises an electrode 5a and a p electrode 6a provided on the upper surface and lower surface of its semiconductor device. An oxide layer 7a containing the oxide of gallium is provided centered around the exposed parts of the surface of the above described device and side surfaces 10a of the device. In the present embodiment, the oxide layer 7a is also formed on the exposed part of the lower surface of the device. An insulating layer (coating film) 8a composed of silicon nitride or the like is formed on the oxide layer 7a on the upper surface of the device.

In forming this light emitting diode, the p-GaAlAs layer 1a, the p-GaAlAs active layer 3a, and the n-GaAlAs layer 2a are formed on a p-GaAs substrate (not shown) by epitaxial growth. Thereafter, the insulating layer 8a as well as the n electrode 5a are formed on the upper surface of the n-GaAlAs layer 2a.

The above described p-GaAs substrate is then removed as required, the p electrode 6a is formed on the lower surface of the device and then, device isolation is achieved. The above described side surfaces 10a of the device are subjected to etching of approximately 1 to 10 μm, to remove cracking and crystal defects which occur by the above described device isolation. Subsequently, the oxide layer 7a is formed in the exposed parts of the device by annealing treatment also serving as ohmic contact of the electrodes.

Meanwhile, in the light emitting diode having a p-GaAs substrate according to the present embodiment, light emitted from a PN junction surface is partly absorbed into this p-GaAs substrate, thereby to reduce light extraction efficiency to the exterior.

Third Embodiment

Figure 4:
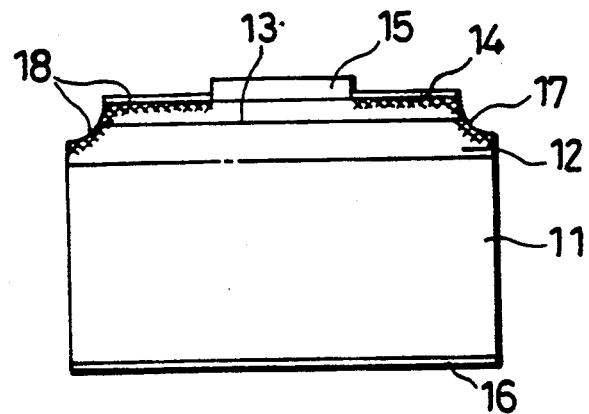
FIG. 4 is a schematic diagram showing a cross-sectional structure of a light emitting diode according to a third embodiment of the present invention.

FIG. 4 shows a single hetero and treating mesa etching type light emitting diode.

The light emitting diode comprises a p-GaAlAs layer 12 and an n-GaAlAs layer 13 on a p-GaAs substrate 11. In addition, the light emitting diode comprises an n electrode 15 and a p electrode 16 provided on the upper surface and lower surface of its semiconductor device. An oxide layer 18 containing the oxide of gallium is provided centered around the exposed parts of the surface of the above described device and stepped portions 17. An insulating layer (coating film) 14 composed of silicon nitride is formed on the oxide layer 18 on the upper surface of the device.

In forming this light emitting diode, the p-GaAlAs layer 12 and the n-GaAlAs layer 13 are formed on the p-GaAs substrate 11 by epitaxial growth and then, the insulating layer 14 is formed on the upper surface of the n-GaAlAs layer 13. Then, the insulating layer 14 in a portion where the n electrode 15 is to be provided is removed and then, the n electrode 15 is formed in this portion.

The above described p electrode 16 is formed on the lower surface of the above described device and then, mesa-etching is made from the n-GaAlAs layer 13 to the p-GaAlAs layer 12, to form the above described stepped portions 17. Subsequently, the above described oxide layer 18 is formed in the exposed parts by annealing treatment also serving as ohmic contact of the electrodes and then, device isolation is achieved.

Meanwhile, the single hetero light emitting diode according to the present embodiment is so constructed that the respective mixture ratios of aluminum in the p-GaAlAs layer 12 and the n-GaAlAs layer 13 differ from each other.

Fourth Embodiment

Figure 5:
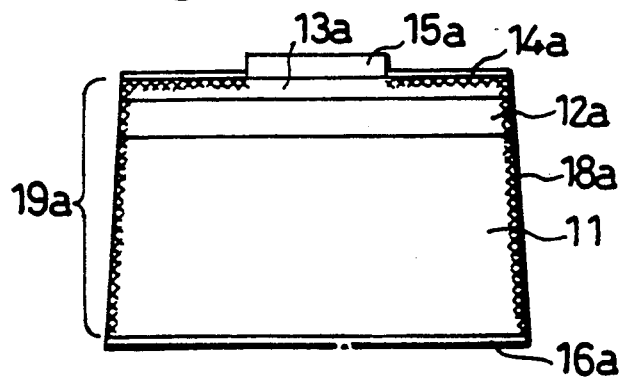
FIG. 5 is a schematic diagram showing a cross-sectional structure of a light emitting diode according to a fourth embodiment of the present invention.

FIG. 5 shows a single hetero and no treating mesa etching type light emitting diode.

The light emitting diode comprises, for example, a p-GaAlAs layer 12a and an n-GaAlAs layer 13a. In addition, the light emitting diode comprises an n electrode 15a and a p electrode 16a provided on the upper surface and lower surface of its semiconductor deice. An oxide layer 18a containing the oxide of gallium is provided centered around the exposed parts of the surface of the above described device and side surfaces 19a of the device. An insulating layer (coating film) 14a composed of silicon nitride or the like is formed on the oxide layer 18a on the upper surface of the device.

In forming this light emitting diode, the p-GaAlAs layer 12a and the n-GaAlAs layer 13 are formed on a p-GaAs substrate 11a by epitaxial growth and then, the insulating layer 14a is formed on the upper surface of the n-GaAlAs layer 13a. Subsequently, the insulating layer 14a in a portion where the n electrode 15a is to be provided is removed and then, the n electrode 15a is formed in this portion.

The p electrode 16a is formed on the lower surface of the above described device and then, device isolation is achieved. The above described side surfaces 19a of the device are then subjected to etching of approximately 1 to 10 μm, to remove cracking and crystal defects which occur by the above described device isolation. Subsequently, the oxide layer 18a is formed in the exposed parts by annealing treatment also serving as ohmic contact of the electrodes.

Meanwhile, when the above described etching is made, the p-GaAlAs layer 12a and the n-GaAlAs layer 13a are etched easier than the p-GaAs substrate 11a, so that the side surfaces 19a of the device are inclined as shown in FIG. 5.

Fifth Embodiment

Figure 6:
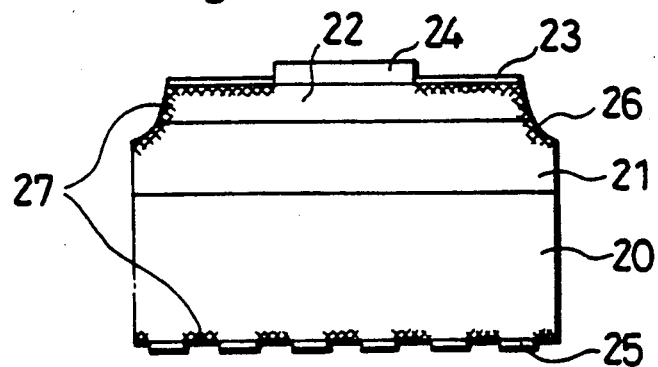
FIG. 6 is a schematic diagram showing a cross-sectional structure of a light emitting diode according to a fifth embodiment of the present invention.

FIG. 6 shows a homo PN junction and treating mesa etching type light emitting diode.

The light emitting diode comprises an n-GaAlAs layer 21 and a p-GaAlAs layer 22 on an n-GaAs substrate 20. In addition, the light emitting diode comprises a p electrode 24 and an n electrode 25 provided on the upper surface and lower surface of its semiconductor device. An oxide layer 27 containing the oxide of gallium is provided centered around the exposed parts of the upper surface of the above described device and stepped portions 26. In the present embodiment, the oxide layer 27 is also formed in the exposed part of the lower surface of the device. An insulating layer (coating film) 23 composed of silicon nitride or the like is formed on the oxide layer 27 on the upper surface of the device.

In forming this light emitting diode, the n-GaAlAs layer 21 and the p-GaAlAs layer 22 are formed on the n-GaAs substrate 20 by epitaxial growth and then, the insulating layer 23 is formed on the upper surface of the p-GaAlAs layer 22. Then, the insulating layer 23 in a portion where the p electrode 24 is to be provided is removed and then, the p electrode 24 is formed is this portion.

After the n electrode 25 is formed on the lower surface of the above described device and then, mesa-etching is made from the p-GaAlAs layer 22 to the n-GaAlAs layer 21, thereby to form the above described stepped portions 26. Subsequently, the above described oxide layer 27 is formed in the exposed parts by annealing treatment also serving as ohmic contact of the electrodes and then, device isolation is achieved.

Meanwhile, the homo PN junction light emitting diode according to the present embodiment is so constructed that the respective mixture ratios of aluminum in the n-GaAlAs layer 21 and the p-GaAlAs layer 22 are approximately the same.

Furthermore, the n electrode 25 is formed partly in a stripe shape, as shown in FIG. 6, thereby to make the area of the electrode smaller than those in the embodiments 3 and 4. Accordingly, the amount of absorption of light emitted from a PN junction surface into the n electrode 25 is decreased, thereby to increase light extraction efficiency to the exterior.

Sixth Embodiment

Figure 7:
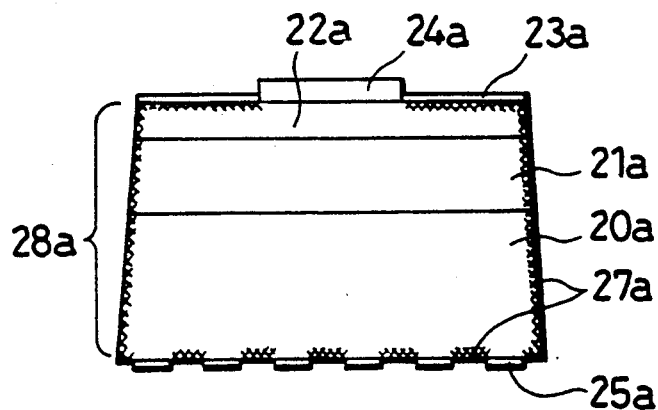
FIG. 7 is a schematic diagram showing a cross-sectional structure of a light emitting diode according to a sixth embodiment of the present invention.

FIG. 7 shows a homo PN junction and no treating mesa etching type light emitting diode.

The light emitting diode comprises, for example, an n-GaAlAs layer 21a and a p-GaAlAs layer 22a on an n-GaAs substrate 20a. In addition, the light emitting diode comprises a p electrode 24a and an n electrode 25a provided on the upper surface and lower surface of its semiconductor device. An oxide layer 27a containing the oxide of gallium is provided centered around the exposed parts of the surface of the above described device and side surfaces 28a of the device. In the present embodiment, the oxide layer 27a is also formed in the exposed part of the lower surface of the device. An insulating layer (coating film) 23a composed of silicon nitride or the like is formed on the oxide layer 27a on the upper surface of the device.

In forming this light emitting diode, the n-GaAlAs layer 21a and the p-GaAlAs layer 22a are formed on the n-GaAs substrate 20a by epitaxial growth and then, the insulating layer 23a is formed on the upper surface of the p-GaAlAs layer 22a. Then, the insulating layer 23a in a portion where the electrode 24a is to be provided is removed and then, the electrode 24a is formed in this portion.

The n electrode 25a is formed on the lower surface of the above described device and then, device isolation is achieved. Subsequently, the above described side surfaces 28a of the device are subjected to etching of approximately 1 to 10 μm, to remove cracking and crystal detects which occur by the above described device isolation. Subsequently, the oxide layer 27a is formed in the exposed parts by annealing treatment also serving as ohmic contact of the electrodes.

Although in the above described embodiments 3 to 6, the GaAs substrates 11, 11a, 20 and 20a are formed, the GaAs substrates may be removed as required. In this case, the electrodes 16, 16a, 25 and 25a are formed on the lower surfaces of the exposed p or n-GaAlAs layers 12, 12a, 21 and 21a.

Figure 8:
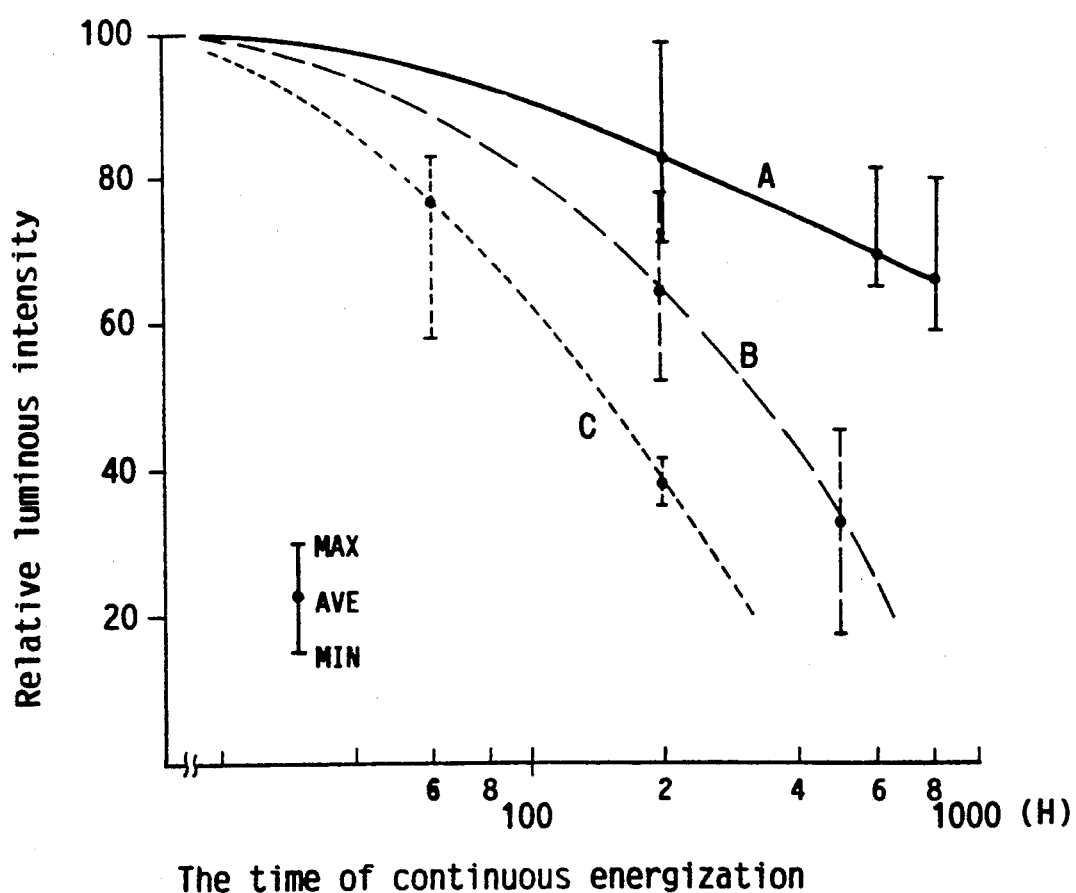
FIG. 8 is a diagram showing the characteristics of the above described respective light emitting diodes according to the present invention.

Description is now made of the function and the effect of each of the above described embodiments with reference to a characteristic diagram of FIG. 8.

The characteristic diagram of FIG. 8 shows the results of continuous energization of each of the light emitting diodes constructed a described above. It has been said that the light emitting diode containing aluminum is particularly inferior in humidity resistance. Accordingly, this characteristic diagram shows characteristics with time in a case where the luminous intensity in the early stage of a period during which a current of 30 mA is continuously caused to flow in a laboratory at a temperature of 80°·C. and at a humidity of 96% is set to 100.

In this characteristic diagram, a characteristic A indicated by a solid line shows the average luminous intensity of lots of the light emitting diodes having the thermal oxide layers 7, 7a, 18, 18a, 27 and 27a and the insulating layers 8, 8a, 14, 14a, 23 and 23a, a characteristic B indicated by a broken line shows characteristics of light emitting diodes having the above described thermal oxide layers whose average oxidation rate is 75% and having no insulating layers, and a characterstic C indicated by a dotted line shows characteristics of prior light emitting diodes having no the above described thermal oxide layers. In the light emitting diodes having no stepped portions 4, 17 and 26, an intermediate characteristic between the above described characteristics A and B is obtained even if they have no insulating layers.

In the above described respective embodiments, the oxide layers 7, 7a, 18, 18a, 27 and 27a containing the oxide of gallium are respectively provided inside of the upper surface and lower surface excluding portions where the electrodes 5 and 6, 5a and 6a, 15, 15a, 24 and 25, and 24a and 25a are provided and the side surfaces. If the oxide layers 7, 7a, 18, 18a, 27 and 27a are respectively provided inside of at least the upper surfaces excluding the portions where the electrodes 5, 5a, 15, 15a, 24 and 24a are provided, however, the humidity resistance of each of the light emitting diodes are improved and the degradation of the semiconductor device can be restrained. The reason for this is that the upper surface is protected by providing the oxide layer inside of the upper surface because the upper surface is liable to be inferior in humidity resistance to the lower surface and the side surfaces.

The function and the effect of the present invention are summarized as follows.

(1) The thermal oxide layer is provided between the insulating layer and the upper surface of the semiconductor device as in the present invention, so that the upper surface of the semiconductor device is stabilized. As a result, the adhesion of the insulating layer and the upper surface of the semiconductor device is improved, so that the insulating layer is not damaged. Consequently, the humidity resistance of the light emitting diode is improved and the degradation of the semiconductor device is delayed. In addition, the average oxidation rate of the above described thermal oxide layer and particularly, the oxidation rate of gallium under the upper surface of the semiconductor device is raised, thereby to lengthen the life of the semiconductor device.

(2) Particularly, the humidity resistance of the above described treating mesa etching type light emitting diode having stepped portions is very good, as shown by the characteristic A. More specifically, in this treating mesa etching type light emitting diode, the above described insulating layer is provided on the upper surface of the semiconductor device also in the sense that the edge parts of the stepped portions are protected, so that the humidity resistance of the light emitting diode is further improved and the degradation of the semiconductor device is reduced.

(3) Furthermore, the humidity resistance of the above described no treating mesa etching type light emitting diode having no stepped portions is intermediate between the characteristics A and B, that is, is slightly inferior. However, the thermal oxide layer is provided inside of the side surfaces of the semiconductor device, so that the humidity resistance of the light emitting diode is good.

(4) Additionally, the above described treating mesa etching type light emitting diode is in a mesa shape. Accordingly, no cracking and crystal defects occur at the time of device isolation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting diode comprising:
   a semiconductor device having a plurality of GaAlAs layers sequentially formed;
   an electrode provided on an upper surface and a lower surface of said semiconductor device; and
   a thermal oxide layer containing the oxides of gallium, aluminum and arsenic formed from and at said upper surface of said semiconductor device excluding a portion where the electrode is provided.

2. The light emitting diode according to claim 1, wherein the structure of the semiconductor device is of one of a single hetero type, a double hetero type and a homo PN junction type.

3. The light emitting diode according to claim 1, wherein the average oxidation rate of the device at a depth of 0.01 µm from said upper surface of the device in said thermal oxide layer is 50 to 95%.

4. The light emitting diode according to claim 1, wherein the average oxidation rate of the device at a depth of 0.01 µm from said upper surface of the device in said thermal oxide layer is 80 to 95%.

5. The light emitting diode of claim 1 wherein said thermal oxide layer is formed by annealing said upper surface of said semiconductor device.

6. A light emitting diode comprising:
   a semiconductor device having a plurality of GaAlAs layers sequentially formed;
   an electrodes provided on an upper surface and a lower surface of said semiconductor device; and
   a thermal oxide layer containing the oxides of gallium, aluminum and arsenic formed from and at said upper surface of said semiconductor device excluding a portion where the electrode is provided; and
   an insulating layer formed on said thermal oxide layer of said upper surface part.

7. The light emitting diode according to claim 6, wherein the structure of the semiconductor device is of one of a single hetero type, a double hetero type and a homo PN junction type.

8. The light emitting diode according to claim 6, wherein the average oxidation rate of the device at a depth of 0.01 µm from said upper surface of the device in said thermal oxide layer is 50 to 95%.

9. The light emitting diode according to claim 6, wherein the average oxidation rate of the device at a depth of 0.01 µm from said upper surface of the device in said thermal oxide layer is 80 to 95%.

10. The light emitting diode of claim 6 wherein said thermal oxide layer is formed by annealing said upper surface of said semiconductor device.

11. A light emitting diode comprising:
    a semiconductor device having a plurality of GaAlAs layers sequentially formed;
    an electrodes provided on an upper surface and a lower surface of said semiconductor device;
    stepped portions provided in the peripheral part of said semiconductor device, and
    a thermal oxide layer containing the oxides of gallium, aluminum and arsenic formed from and at said upper surface of said semiconductor device excluding a portion where the electrode is provided and at said stepped portions.

12. The light emitting diode according to claim 11, wherein the structure of the semiconductor device is of one of a single hetero type, a double hetero type and a homo PN junction type.

13. The light emitting diode according to claim 11, wherein the average oxidation rate of the device at a depth of 0.01 µm from said upper surface of the device in said thermal oxide layer is 50 to 95%.

14. The light emitting diode according to claim 11, wherein the average oxidation rate of the device at a depth of 0.01 µm from said upper surface of the device in said thermal oxide layer is 80 to 95%.

15. The light emitting diode of claim 11 wherein said thermal oxide layer is formed by annealing said upper surface of said semiconductor device.

16. A light emitting diode comprising:
    a semiconductor device having plurality of GaAlAs layers sequentially formed;
    an electrode provided on an upper surface and a lower surface of said semiconductor device;
    stepped portions provided in the peripheral part of said semiconductor device;
    a thermal oxide layer containing the oxides of gallium, aluminum and arsenic formed from and at said stepped portions; and
    an insulating layer formed on said thermal oxide layer provided at the upper surface part.

17. The light emitting diode according to claim 16, wherein the structure of the semiconductor device is of one of a single hetero type, a double hetero type and a homo PN junction type.

18. The light emitting diode according to claim 16, wherein the average oxidation rate of the device at a depth of 0.01 µm from said upper surface of the device in said thermal oxide layer is 50 to 95%.

19. The light emitting diode according to claim 16, wherein the average oxidation rate of the device at a depth of 0.01 µm from said upper surface of the device in said thermal oxide layer is 80 to 95%.

20. The light emitting diode of claim 16 wherein said thermal oxide layer is formed by annealing said upper surface of said semiconductor device.

* * * * *